(12) United States Patent
Reid et al.

(10) Patent No.: US 7,659,214 B2
(45) Date of Patent: Feb. 9, 2010

(54) METHOD FOR GROWING AN OXYNITRIDE FILM ON A SUBSTRATE

(75) Inventors: Kimberly G. Reid, Austin, TX (US); Anthony Dip, Cedar Creek, TX (US)

(73) Assignee: Tokyo Electron Limited, Tokyo (JP)

( * ) Notice: Subject to any disclaimer, the term of this patent is extended or adjusted under 35 U.S.C. 154(b) by 297 days.

(21) Appl. No.: 11/865,060

(22) Filed: Sep. 30, 2007

(65) Prior Publication Data
US 2009/0088000 A1    Apr. 2, 2009

(51) Int. Cl.
*H01L 21/02*    (2006.01)
*H01L 21/314*   (2006.01)
*H01L 21/316*   (2006.01)

(52) U.S. Cl. .............................. 438/775; 257/E21.267; 257/E21.268; 257/E21.285; 438/769; 438/770; 438/773; 438/786

(58) Field of Classification Search ........... 257/E21.267, 257/E21.268, E21.285; 438/769, 770, 773, 438/775, 786
See application file for complete search history.

(56) References Cited

U.S. PATENT DOCUMENTS

| | | | |
|---|---|---|---|
| 5,674,788 A | 10/1997 | Wristers et al. | |
| 5,808,398 A | 9/1998 | Stoffels et al. | |
| 5,939,763 A | 8/1999 | Hao et al. | |
| 5,998,270 A | 12/1999 | Gilmer et al. | |
| 6,001,694 A | 12/1999 | Shih et al. | |
| 6,248,628 B1 | 6/2001 | Halliyal et al. | |
| 6,436,848 B1 | 8/2002 | Ramkumar | |
| 6,450,116 B1 | 9/2002 | Noble et al. | |
| 6,649,537 B1 | 11/2003 | Reder et al. | |
| 6,683,010 B1 | 1/2004 | Lim et al. | |
| 6,692,249 B1 | 2/2004 | Beatty et al. | |
| 6,869,892 B1 | 3/2005 | Suzuki et al. | |
| 6,887,797 B2 | 5/2005 | Buchanan et al. | |
| 6,929,699 B2 | 8/2005 | Whitesell | |
| 6,939,756 B1 | 9/2005 | Chung et al. | |
| 2006/0148179 A1 | 7/2006 | Wang et al. | |

OTHER PUBLICATIONS

Babu, Naseer et al., Tunnel Oxide Growth on Silicon with "Wet Nitrous Oxide" Process for Improved Performance Characteristics, IEEE Electron Device Letters, vol. 27, Nov. 2006, pp. 881-883.

(Continued)

*Primary Examiner*—Asok K Sarkar

(57) ABSTRACT

A method for growing an oxynitride film on a substrate includes positioning the substrate in a process chamber, heating the process chamber, flowing a first wet process gas comprising water vapor into the process chamber, and reacting the substrate with the first wet process gas to grow an oxide film on the substrate. The method further includes flowing a second wet process gas comprising water vapor and a nitriding gas comprising nitric oxide into the process chamber, and reacting the oxide film and the substrate with the second wet process gas to grow an oxynitride film. In another embodiment, the method further comprises annealing the substrate containing the oxynitride film in an annealing gas. According to one embodiment of the method where the substrate is silicon, a silicon oxynitride film can be formed that exhibits a nitrogen peak concentration of approximately 3 atomic % or greater.

20 Claims, 8 Drawing Sheets

OTHER PUBLICATIONS

Tada, Y. et al., High Quality Ultra-thin Gate Oxynitride Formation by Fast Ramp Verticle Furnace, 1999 RTP Conference, 8pp.

U.S. Patent and Trademark Office, Non-final Office Action received in related U.S. Appl. No. 10/694,643 dated Mar. 18, 2008, 19pp.

U.S. Patent and Trademark Office, Final Office Action received in related U.S. Appl. No. 10/694,643 dated Nov. 3, 2008, 14pp.

Ellis, K.A. et al., Nitrous Oxide (N2O) Processing for Silicon Oxynitride Gate Dielectrics, IBM J. Res. Develop. vol. 43, No. 3, May 1999, pp. 287-300.

Dang, Sanjit Singh et al., Nitrous Oxide-Based Progressive Silicon Oxynitridation in Furnaces of Different Dimensions, Advanced Materials Research Laboratory, Department of Chemical Engineering, University of Illinois at Chicago, Chicago, IL 60607, Undated, 5 pages.

METHOD FOR GROWING AN OXYNITRIDE FILM ON A SUBSTRATE

CROSS-REFERENCE TO RELATED APPLICATION

This application is related to co-pending U.S. patent application Ser. No. 1/694,643, entitled METHOD FOR GROWING A THIN OXYNITRIDE FILM ON A SUBSTRATE and filed on Mar. 30, 2007, the entire content of which is incorporated herein by reference.

FIELD OF THE INVENTION

The present invention relates to semiconductor substrate processing and, more particularly, to a method for incorporating high concentrations of nitrogen into oxynitride films in conjunction with water vapor thermal oxidation.

BACKGROUND OF THE INVENTION

In the formation of integrated circuits on the surface of a semiconductor substrate, oxynitride films are frequently grown or deposited over the surface of a crystalline substrate such as silicon. Oxynitride films may have superior electrical properties, including high electron mobility and low electron trap density that are desirable for device operation in semiconductor applications. Advantages of nitrogen incorporation in a thin oxide film include: reduced boron penetration through a p-doped polysilicon gate, improved interfacial smoothness, increase in the dielectric constant of the oxynitride film, and improved barrier properties to prevent diffusion of metal oxides or metal gate materials into the underlying substrate. Several methods have been developed for forming oxynitride films for semiconductor applications and, following formation of these films on a substrate, oxynitride films are frequently annealed to further improve their material and electrical properties.

The ability to incorporate nitrogen during processing is of critical importance for device performance. In one example, a thin oxide film may be annealed in the presence of a nitrogen-containing gas, such as nitrous oxide ($N_2O$), ammonia ($NH_3$), nitric oxide (NO), and thermal and plasma nitrogen ($N_2$), at predetermined processing conditions to form an oxynitride film by nitrogen incorporation from the gas into the oxide film. However, one serious shortcoming associated with using current nitrogen sources is variability in nitrogen incorporation and difficulty in preventing nitrogen penetration into the substrate. Both of these shortcomings deteriorate performance of the resulting metal-oxide semiconductor field-effect transistor (MOSFET). Other problems include unacceptable oxynitride thickness variations and variation in nitrogen concentration in the oxynitride films. In other words, current processing techniques result in batch to batch variability, which directly impacts the overall quality of the oxynitride film and any semiconductor device constructed with the oxynitride film.

There is thus a need for new methods that provide high nitrogen incorporation at controlled depths while providing a controlled rate of oxide growth. Also, what is needed is improved reliability of nitrogen incorporation and tailoring the concentration and location of nitrogen within the oxide film.

SUMMARY OF THE INVENTION

The present invention provides a method for growing an oxynitride film on a substrate. In one embodiment, the method includes positioning the substrate in a process chamber, heating the process chamber to a processing temperature, flowing a first wet process gas comprising water vapor into the process chamber to grow an oxide film on the substrate, and flowing a second wet process gas comprising water vapor and a nitriding gas comprising nitric oxide (NO) into the process chamber to grow an oxynitride film from the oxide film.

In another embodiment, the method includes positioning a plurality of substrates in the process chamber of a batch processing system, where the plurality of substrates comprise silicon, heating the process chamber to a processing temperature of at least 850° C., and generating water vapor external to the process chamber by combusting hydrogen gas and oxygen gas. The method further includes flowing a first wet process gas comprising the water vapor and a diluting gas comprising nitrogen into the process chamber, reacting the substrate with the first wet process gas to grow a silicon oxide film on each of the plurality of substrates, flowing a second wet process gas comprising the water vapor, a diluting gas comprising nitrogen, and a nitriding gas comprising nitric oxide into the process chamber, and reacting the silicon oxide film and the substrate with the second wet process gas to grow a silicon oxynitride film having a thickness greater than approximately 4 nm on the substrate. In one embodiment, the substrates containing the silicon oxynitride film may be further annealed in an annealing gas. According to one embodiment of the invention, the resulting silicon oxynitride film can have a nitrogen peak concentration between approximately 3 atomic % and approximately 5 atomic %, or greater.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

DETAILED DESCRIPTION OF SEVERAL EMBODIMENTS

The inventors of related U.S. patent application Ser. No. 1/694,643, entitled METHOD FOR GROWING A THIN OXYNITRIDE FILM ON A SUBSTRATE, which are the inventors of the present application, realized the above-mentioned shortcomings associated with both the current sources of nitrogen and the methods of incorporating nitrogen into the oxide films. The related invention provides a method for growing a thin oxynitride film on a heated substrate by flowing a wet process gas comprising water vapor and a nitriding gas comprising nitric oxide into a process chamber containing the heated substrate. The thin oxynitride film can have a thickness of less than approximately 4 nm and may, for example, be used as a gate dielectric in a gate stack of a semiconductor device. As those skilled in the art will readily realize, oxynitride films having a thickness greater than approximately 4 nm may be grown by varying the processing conditions, for example by increasing the substrate temperature or utilizing longer processing times. However, a restricted thermal budget may not allow for increasing the substrate temperature and longer processing times may not be cost effective in high volume manufacturing of semiconductor devices.

The current inventors have realized that the related invention can be improved to more efficiently grow a thicker oxynitride film with similar nitrogen peak concentrations at the same substrate temperature (e.g., approximately 900° C.). For example, the improved method described in embodiments of the current invention provides a practical way of growing of an oxynitride film having a thickness of greater than approximately 4 nm, for example between approximately 5 and approximately 15 nm, between approximately 6 and approximately 10 nm or between approximately 6 and approximately 7 nm. According to one embodiment of the invention, the method includes performing a first step that reacts a substrate with a first wet process gas comprising water vapor to grow on oxide film on the substrate, and performing a second step that reacts the oxide film and the substrate with a second process gas comprising water vapor and a nitriding gas comprising nitric oxide to grow an oxynitride film on the substrate.

As is known in the art, oxide films grown on semiconductor substrates are utilized in semiconductor fabrication as gate dielectrics, particularly for metal-oxide semiconductor (MOS) devices. Two important semiconductor materials are silicon and germanium. The demand for high-k dielectrics has required manufacturers to augment existing oxide films (e.g., oxide films on silicon and germanium) by incorporating nitrogen into the oxide films. It is known in the art that nitrogen incorporation into the oxide films increases the dielectric constant of the resulting oxynitride film, and allows thinner gate dielectrics to be grown on these semiconductor substrate materials.

Figure 1:
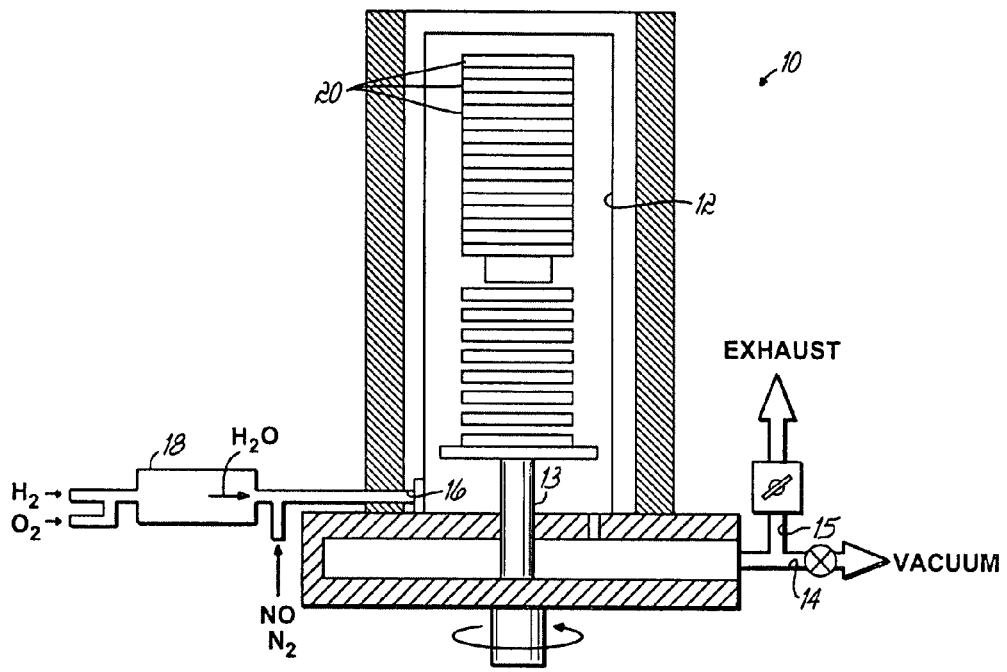
FIG. 1 schematically shows a cross-sectional view of a batch processing system configured to process a plurality of substrates according to an embodiment of the invention.
Figure 2A:
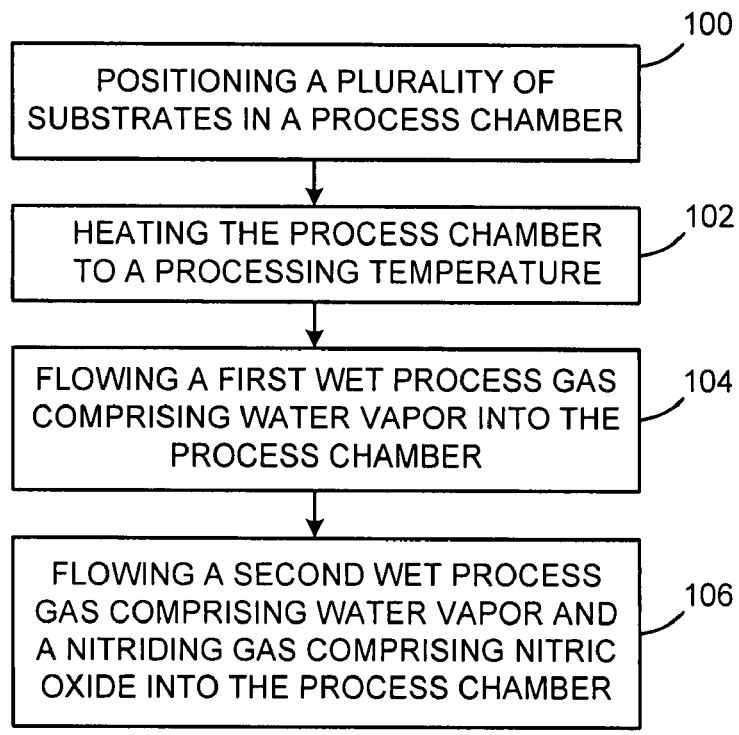
FIG. 2A shows a process flow diagram of one embodiment of the method of growing an oxynitride film on a substrate.

FIG. 1 shows a cross-sectional view of a batch processing system 10 having a process chamber 12 with a plurality of substrates 20 positioned within the process chamber 12. As one skilled in the art will observe, while a batch processing is shown and described, the method is also applicable to single substrate processing where the substrates are processed one at a time. FIG. 2A depicts a process flow diagram for forming an oxynitride film on the substrates 20 in FIG. 1.

Referring now to both FIGS. 1 and 2A, in one embodiment of the method in 100, the plurality of substrates 20 are positioned in the process chamber 12. The substrate 20 may be positioned on a rotatable substrate holder 13. As one skilled in the art will observe, positioning or loading the substrates 20 within the batch processing system 10 may include exhausting the process chamber 12 through the exhaust port 15 and evacuating the process chamber 12 through a vacuum port 14 following insertion of the substrates 20. In addition, positioning the substrates 20 within the batch processing system 10 may also include purging the process chamber 12 with inert gas, such as nitrogen, to dilute or reduce the concentration of organic contaminants within the process chamber 12.

The process chamber 12 is then heated to a processing temperature, in 102. During heating of the process chamber 12, a heating rate may be from a few degrees per minute to 100 or more degrees per minute.

Following heating, in 104, a first wet process gas is introduced into the process chamber 12 through an inlet port 16. The first wet process gas comprises water ($H_2O$) vapor but not a nitriding gas. Oxygen from the water vapor deposits onto the substrate 20 to thereby grow an oxide film on each of the substrates 20. In 106, a second wet process gas comprising water vapor and a nitriding gas is introduced into the process chamber 12 through the inlet port 16. The nitriding gas comprises nitric oxide (NO) such that nitrogen from the nitric oxide is incorporated into the oxide film from step 104, thereby forming an oxynitride film 30 on each of the substrates 20, as depicted on a single substrate 20 in FIG. 3. Now additional embodiments of the method will be described.

In one embodiment, the process chamber 12 is heated to a processing temperature greater than approximately 600° C. The nitrogen incorporation into the oxynitride film 30 at temperatures lower than 600° C. may be too slow. Therefore, at low temperatures, the process may not be cost effective. In addition, for some substrates 20, electrical properties quickly deteriorate at processing temperatures below 600° C. In another embodiment, the processing temperature is less than the temperature at which the substrates 20 deform or soften. Generally, the processing temperature is less than approximately 1100° C. In another embodiment, the processing temperature is from approximately 850° C. to approximately 1000° C. for cost effective manufacturing and high oxynitride film quality.

In one embodiment, once the process chamber 12 reaches the processing temperature, the first wet process gas comprising water vapor is introduced into the process chamber 12. Thus the substrates are surrounded by a processing ambient including the water vapor at the process temperature. The processing ambient reacts with the substrates 20 to grow an oxide film from the water vapor, thus forming an oxide film on each of the plurality of substrates 20. Next, a second wet process gas comprising water vapor and a nitriding gas comprising nitric oxide are introduced into the process chamber 12. Thus, the substrates 20 are surrounded by a processing ambient including the water vapor and the nitric oxide at the processing temperature. The processing ambient reacts with the substrates 20 to further grow an oxide film from the water vapor and nitrogen from the nitric oxide being incorporated into the growing oxide film thus forming an oxynitride film 30 on each of the plurality of substrates 20, as shown on the single substrate 20 in FIG. 3.

In conjunction with the flow of the first and second wet process gases, which creates the processing ambients, the processing ambients have a processing pressure. The processing pressure may range from atmospheric pressure to below 10 Torr. According to one embodiment, the processing pressure can between approximately 500 Torr and approximately 760 Torr, or between approximately 600 Torr and approximately 760 Torr. According to another embodiment, the processing pressure can be between approximately 600 Torr and approximately 700 Torr. In one embodiment, the processing pressure is set in conjunction with the processing temperature to control a growth rate of the oxide film and the oxynitride film 30. One skilled in the art will observe that the processing pressure and the flow rates of the gases may change at any time during the oxynitride film growth. Therefore, the term "set" is not limited to a single act of setting the processing pressure, flow rates of gases, or processing temperature. Rather, set may refer to any number of settings or adjustments such that growing an oxide film and the oxynitride film 30 is in accordance with any quality standards either from internal controls, from industry, or determined by the customer.

According to one embodiment of the invention, prior to flowing the first wet process gas into the process chamber 12, the first wet process gas is generated external to the process chamber 12, as shown in FIG. 1, by combustion of a hydrogen gas ($H_2$) and an oxygen gas ($O_2$). One example of generating the first wet process gas is with a high-dilution pyrogenic torch 18, as depicted in FIG. 1, developed by Tokyo Electron Ltd., Nirasaki, Yamanashi, Japan. The high-dilution pyrogenic torch 18 combusts small flows of hydrogen gas and oxygen gas. The pyrogenic torch 18 thus generates the wet process gas, i.e., water vapor in the form of steam, external to the process chamber 12. The first wet process gas then flows into the process chamber 12.

In another embodiment of the method, a diluting gas is used to dilute the first and second wet process gases in the processing ambients. The ratio of the concentration of the diluting gas to the concentration of the first wet process gas and the second wet process gas may influence the growth rate of the oxide film and the growth rate of the oxynitride film 30, respectively. Therefore, the diluting gas may be used to control the oxide film growth rate and the oxynitride film growth rate. In one embodiment, the diluting gas comprises nitrogen ($N_2$), as shown in FIG. 1. However, other non-reactive gases may be used, for example, argon (Ar). Still referring to FIG. 1, those skilled in the art will readily realize that a nitrogen diluting gas may be used to dilute the first wet process gas without flowing NO into the process chamber.

Figure 2B:
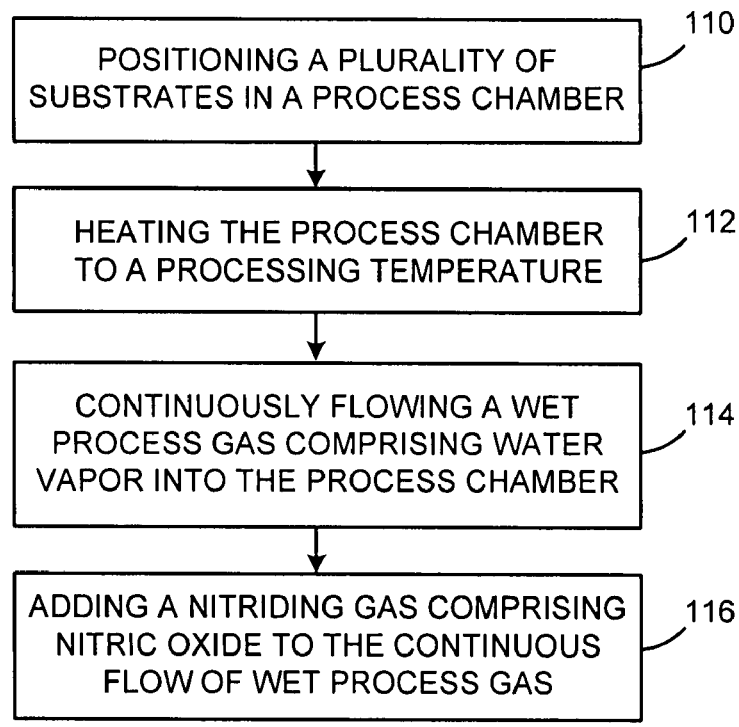
FIG. 2B shows a process flow diagram of another embodiment of the method of growing an oxynitride film on a substrate.

Referring now to both FIGS. 1 and 2B, according to another embodiment of the invention, in 110, the plurality of substrates 20 are positioned in the process chamber 12, and in 112, the process chamber 12 is then heated to a processing temperature. Following heating, in 114, a wet process gas is continuously flowed into the process chamber 12 through an inlet port 16. The wet process gas comprises water ($H_2O$) vapor and optionally a diluting gas. Oxygen from the water vapor grows an oxide film on each of the substrates 20. In 116, a nitriding gas is added to the continuous flow of the wet process gas and introduced into the process chamber 12 through the inlet port 16. The nitriding gas comprises nitric oxide (NO) such that nitrogen from the nitric oxide is incorporated into the oxide film from step 114, thereby forming an oxynitride film 30 on each of the substrates 20, as depicted on a single substrate 20 in FIG. 3.

Figure 3:
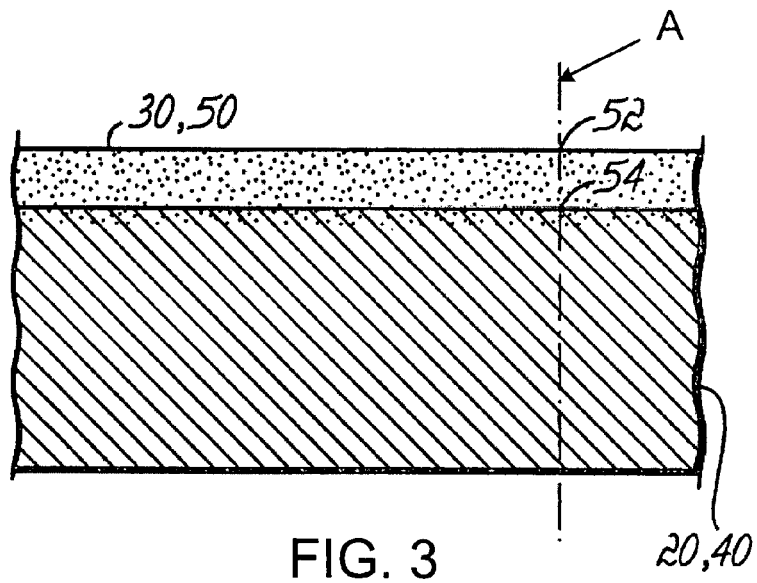
FIG. 3 is a cross-sectional view of the substrate with the oxynitride film grown according to one embodiment of the invention.

In another embodiment of the method, once the oxynitride film 30 is grown on each of the substrates 20 as illustrated in FIG. 3, the substrates 20 having the oxynitride film 30 thereon are annealed. As is known in the art, annealing the oxynitride film 30 on the substrate 20 may modify the properties of the device, particularly the film's electrical properties. According to embodiments of the method, during annealing, the processing ambient, the processing pressure and processing temperature, discussed above, may be modified. For example, following flowing the second wet process gas into the process chamber 12, the process chamber 12 may be vacuum purged one or more times to remove the processing ambient containing the second wet process gas and the diluting gas, if any, prior to annealing. Once purged of the processing ambient, an annealing gas may be introduced and an annealing temperature and an annealing pressure may be established within the processing chamber, which may require raising or lowering the temperature and/or pressure from the processing temperature and processing pressure. Alternatively, the substrates 20 having the oxynitride film 30 thereon may be transferred to a different treatment system for annealing. The annealing temperature and annealing pressure may have similar ranges as the processing temperature and processing pressure. According to one embodiment, the annealing gas comprises at least one of nitrogen, nitric oxide, nitrous oxide, oxygen, or water, or combinations thereof.

As previously mentioned, FIG. 3 shows a cross-sectional view of the substrate 20 and the oxynitride film 30 grown according to one embodiment of the method. By way of example, when the substrate 20 comprises silicon, referred to as silicon substrate 40, flowing the first wet process gas into the process chamber 12 forms a silicon oxide film, and flowing the second wet process gas and the nitriding gas into the process chamber 12 forms a silicon oxynitride film 50. As shown in FIG. 3, line "A" is drawn through the silicon oxynitride film 50 and into a silicon substrate 40. As one skilled in the art will appreciate, the composition (oxygen, silicon, and nitrogen contents) of the silicon oxynitride film 50 varies along line A from an external surface 52 of the silicon oxynitride film 50 through an interface 54 between the silicon oxynitride film 50 and the silicon substrate 40 and into the silicon substrate 40. As one skilled in the art will appreciate, the "interface" 54 between the silicon substrate 40 and the silicon oxynitride film 50 is not abrupt, but may be described by a smooth, continuous reduction in oxygen concentration from the oxygen content of the silicon oxynitride film 50 to the oxygen content of the silicon substrate 40.

Figure 4A:
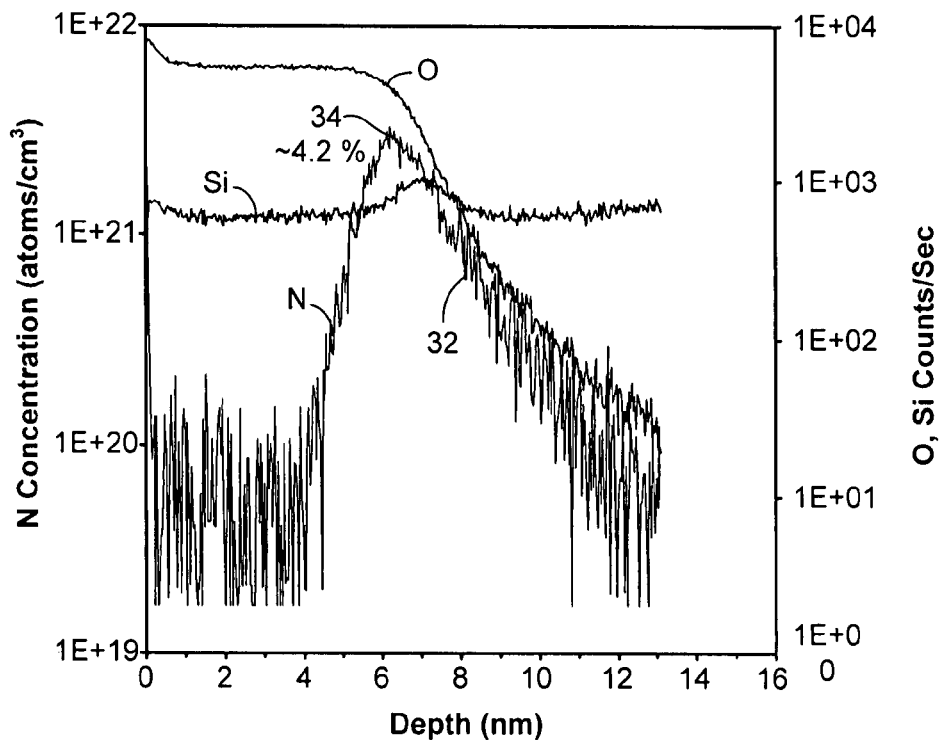
FIGS. 4A-4C show Secondary Ion Mass Spectrometer (SIMS) plots for a silicon oxynitride film grown according to an embodiment of the method.
Figure 4B:
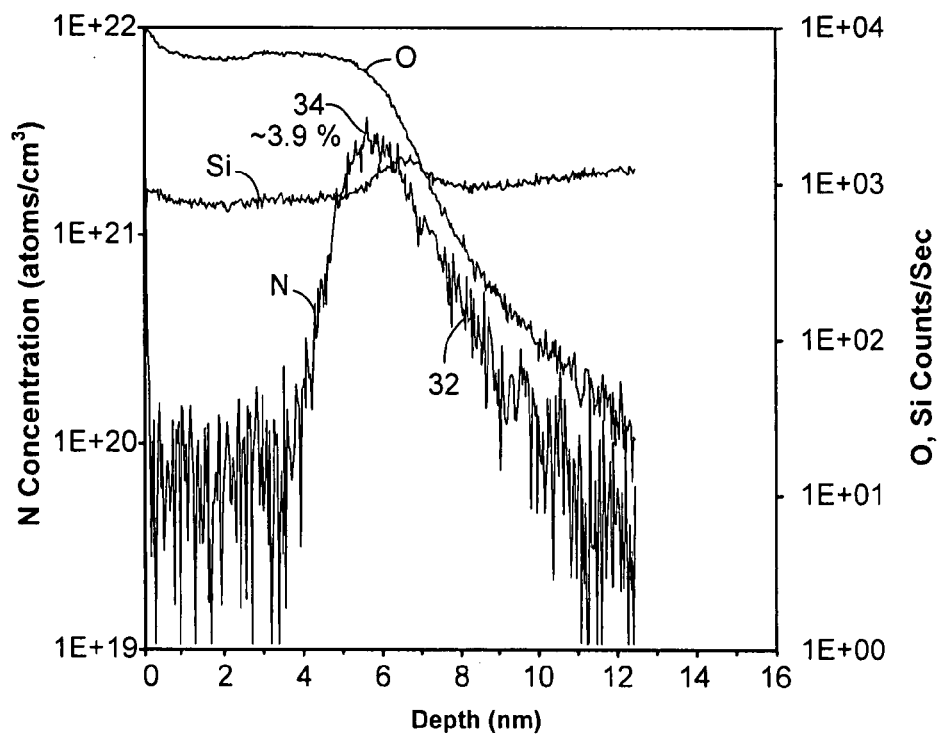
Figure 4C:
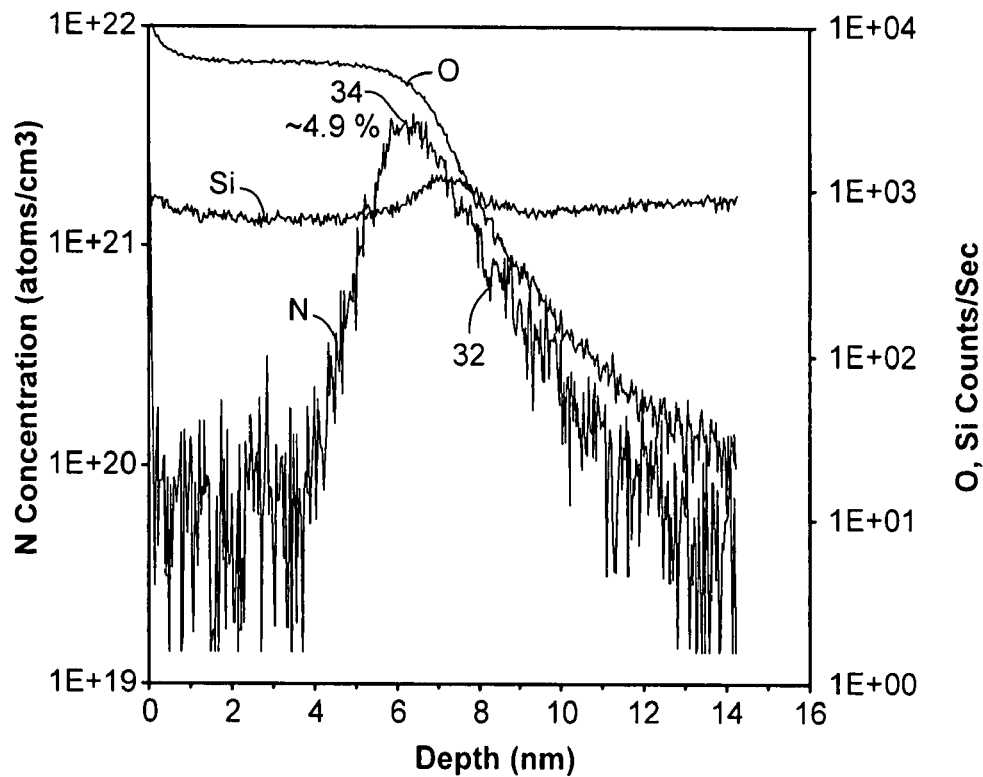

FIGS. 4A-4C shows secondary ion mass spectrometer (SIMS) plots of a silicon oxynitride film 50 grown according to one embodiment of the method of the invention. With reference to FIG. 4A, three distinct concentration profiles are shown with respect to depth, as shown along the x-axis, into the silicon substrate 40. Referring once again to FIG. 3, the location where line A intersects the external surface 52 of the silicon oxynitride film 50 is approximately at the "0 nm" depth shown along the x-axis of FIG. 4A. Thus, proceeding downward along line A, i.e. deeper into the silicon oxynitride film 50, corresponds to moving right along the x-axis of FIG. 4A.

As previously mentioned, FIG. 4A shows three concentration profiles. One profile is for the nitrogen incorporated into the silicon oxynitride film 50, labeled "N." The other two are a silicon profile, labeled "Si," and an oxygen profile, labeled "O." The nitrogen profile 32 exhibits a peak 34 in concentration within the silicon oxynitride film 50 or silicon substrate 40. Thus, nitrogen incorporation is nearly zero at the external surface 52 of the silicon oxynitride film 50 with a maximum concentration of nitrogen, referred to herein as a nitrogen peak concentration 34, occurring below the external surface 52 of the silicon oxynitride film 50, again the external surface 52 being at approximately 0 nm.

The oxygen profile O illustrates a decrease in oxygen counts per second with depth into the silicon oxynitride film 50. The silicon profile remains fairly constant across the SIMS plot. Determining the location of the interface between the silicon oxynitride film 50 and the silicon substrate 40 from the SIMS plot is generally performed with reference to the oxygen profile O. When referred to herein, "interface" or "oxynitride film-substrate interface" refers to the depth where the oxygen counts per second falls to one-half of the oxygen content at the external surface of the silicon oxynitride film 50. Therefore, with respect to the SIMS plot of FIG. 4A, the interface 54 between the silicon oxynitride film 50 and the silicon substrate 40 occurs at a depth of approximately 6.3 nm. The nitrogen peak concentration 34 occurs at approximately the same depth. According to one embodiment of the method, the nitrogen peak concentration 34 is positioned in the silicon oxynitride film or approximately at the silicon oxynitride film-to-silicon substrate interface 54. The method of the present invention enables modulation of the nitrogen profile 32, both in shape, including the nitrogen peak concentration 34 and width of the nitrogen profile 32, and location of the oxynitride film-substrate interface 54.

The flow rates of the first wet process gas and the second wet process gas may range from 10 sccm (standard cubic centimeters per minute) to 20 slm (standard liters per minute), 1 to 5000 sccm for the nitriding gas, and 100 sccm to 20 slm for the diluting gas. In accordance with the method of the present invention, a silicon oxynitride film 50 with the nitrogen, oxygen, and silicon profiles shown in FIG. 4A was grown on a silicon substrate 40 using the following flow rates and temperatures. The processing temperature was approximately 900° C. and the processing pressure was approximately 615 Torr. The first wet process gas flowed for 12 minutes from the pyrogenic torch 18 to the process chamber 12 from an oxygen gas and hydrogen gas flow rate of approximately 0.2 slm each. The second wet process gas flowed for 10 minutes and further contained an nitric oxide gas flow rate of approximately 1.5 slm. The first and second wet process gases further contained a nitrogen diluting gas having a flow rate of approximately 1.8 slm. The silicon oxynitride film 50 with the SIMS plot shown in FIG. 4A had been further processed according to another embodiment of the method of the present invention by annealing the silicon oxynitride film 50 to reduce interface trap density (Dit) with silicon substrate 40. The annealing temperature was 900° C. The silicon oxynitride film 50 was held at that temperature for 60 minutes in an annealing gas consisting of nitrogen. The resulting silicon oxynitride film 50, having the SIMS plot, shown in FIG. 4A exhibited a nitrogen peak concentration 34 of approximately 4.2 atomic % nitrogen at a depth of approximately 6.3 nm, as shown. The oxynitride film-substrate interface is approximately at the same depth as the nitrogen peak concentration. Moreover, the shape of the nitrogen profile 32 may be described by the area under the nitrogen profile 32, sometimes referred to as a nitrogen dose. The nitrogen dose processed accordingly was $6.6 \times 10^{14}$ (6.6E+14) atoms per cm$^2$.

Another example of a silicon oxynitride film 50 grown according to one embodiment of the method has a nitrogen profile 32 as shown in FIG. 4B. In this example, the second wet process gas was flowed for 15 minutes (compared to 10 minutes in FIG. 4A) while keeping other processing conditions the same. FIG. 4B shows a nitrogen profile 32 having a nitrogen peak concentration 34 of approximately 3.9 atomic % at a depth of approximately 6.6 nm and a nitrogen dose of approximately $6.3 \times 10^{14}$ atoms per cm$^2$. The oxynitride film-substrate interface is at approximately the same depth as the nitrogen peak concentration 34.

Yet another example of a silicon oxynitride film 50 grown according to one embodiment of the method has a nitrogen profile 32 as shown in FIG. 4C. In this example, the second wet process gas was flowed for 20 minutes (compared to 10 and 15 minutes in FIGS. 4A and FIG. 4B, respectively) while keeping other processing conditions the same. FIG. 4C shows a nitrogen profile 32 having a nitrogen peak concentration 34 of approximately 4.9 atomic % at a depth of approximately 6.8 nm and a nitrogen dose of approximately $8.4 \times 10^{14}$ atoms per cm$^2$. The oxynitride film-substrate interface is at the same depth as the nitrogen peak concentration 34.

Figure 5A:
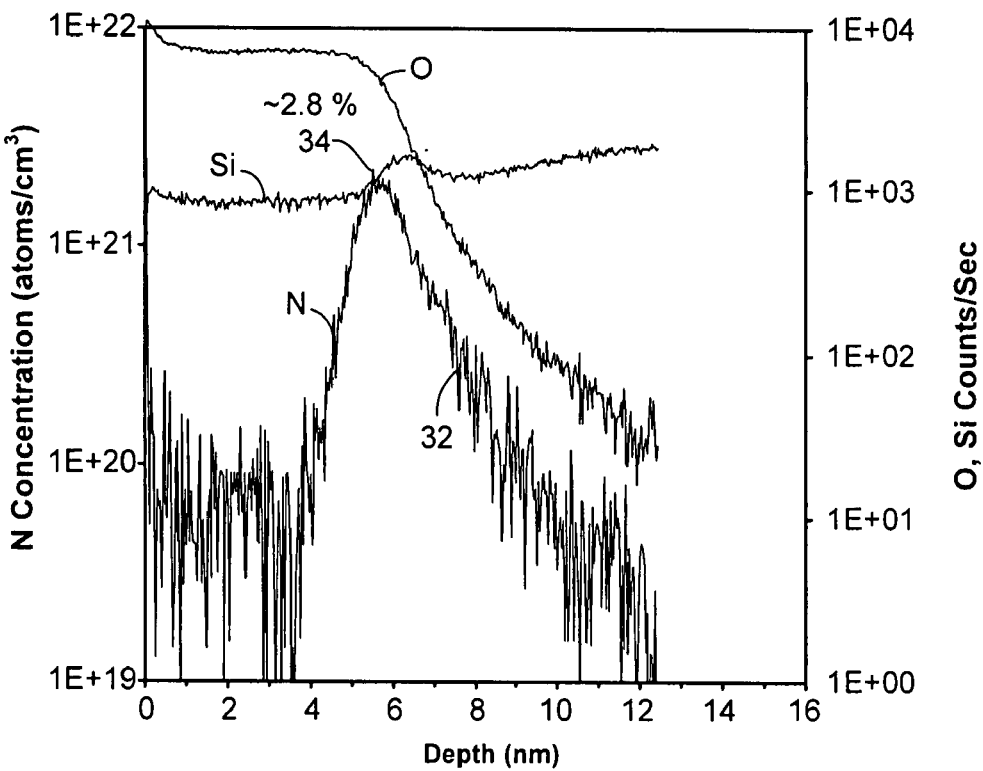
FIGS. 5A-5D show SIMS plots for silicon oxynitride films grown according to an embodiment of the method.
Figure 5B:
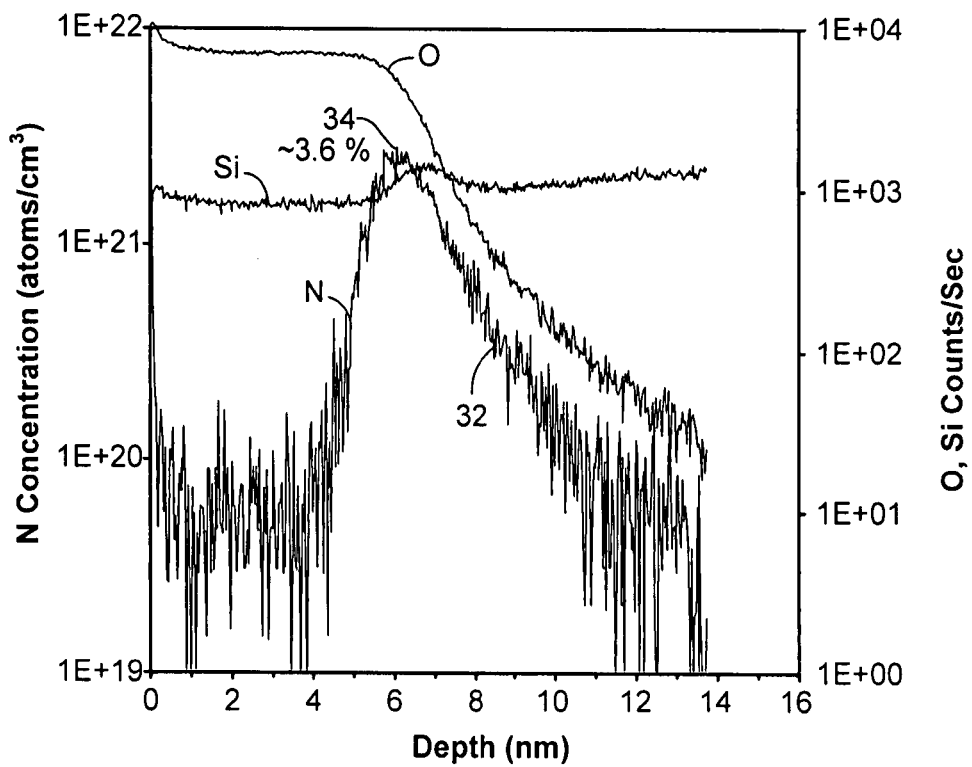
Figure 5C:
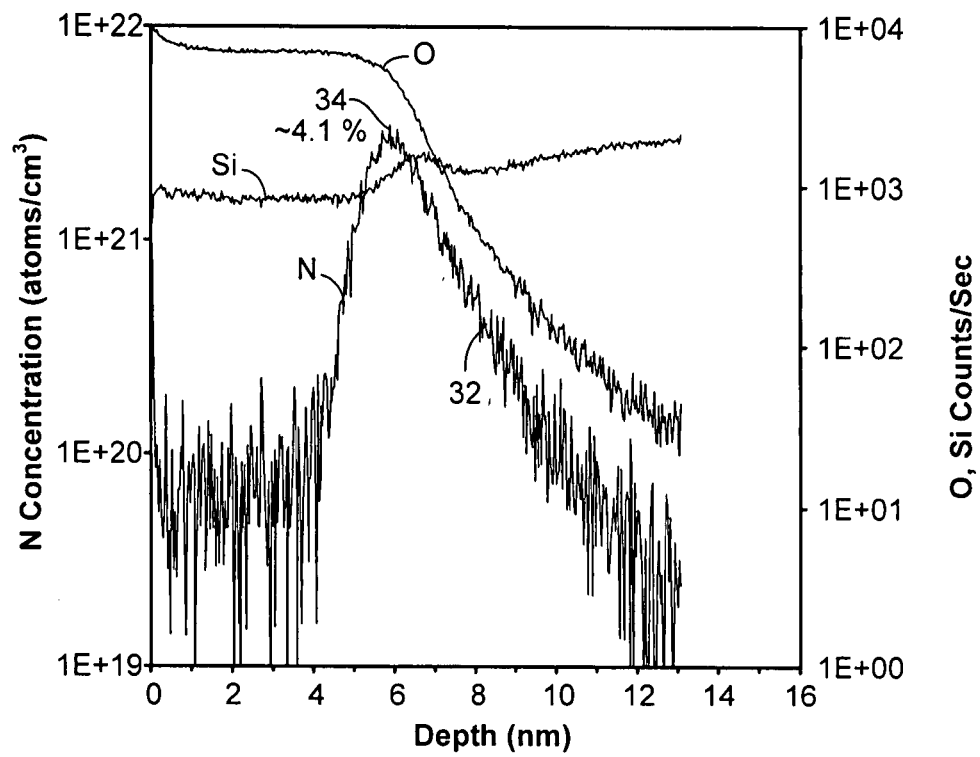

FIGS. 5A, 5B, and 5C illustrate concentration profiles for other silicon oxynitride films 50 grown according to an embodiment of the method of the present invention. In accordance with the method of the present invention, a silicon oxynitride film 50 with the nitrogen, oxygen, and silicon profiles shown in FIG. 5A was grown on a silicon substrate 40 using the following flow rates and temperatures. The processing temperature was approximately 900° C. and the processing pressure was approximately 615 Torr. The first wet process gas flowed for 14 minutes from the pyrogenic torch 18 to the process chamber 12 from an oxygen gas and hydrogen gas flow rate of approximately 0.2 slm each. The second wet process gas flowed for 5 minutes and further contained an nitric oxide gas flow rate of approximately 2 slm. The first and second wet process gases further contained a nitrogen diluting gas having a flow rate of approximately 1.8 slm. The silicon oxynitride film 50 with the SIMS plot shown in FIG. 5A had been further processed according to another embodiment of the method of the present invention by annealing the silicon oxynitride film 50 to reduce interface trap density (Dit) with silicon substrate 40. The annealing temperature was 900° C. The silicon oxynitride film 50 was held at that temperature for 60 minutes in an annealing gas consisting of nitrogen. The resulting silicon oxynitride film 50, having the SIMS plot, shown in FIG. 5A exhibited a nitrogen peak concentration 34 of approximately 2.8 atomic % nitrogen at a depth of approximately 6.6 nm and a nitrogen dose of approximately $3.6 \times 10^{14}$ atoms per cm$^2$, as shown. The oxynitride film-substrate interface is approximately at the same depth as the nitrogen peak concentration 34.

Another example of a silicon oxynitride film 50 grown according to one embodiment of the method has a nitrogen profile 32 as shown in FIG. 5B. In this example, the second wet process gas was flowed for 10 minutes (compared 5 minutes in FIG. 5A) while keeping other processing conditions the same. FIG. 5B shows a nitrogen profile 32 having a nitrogen peak concentration 34 of approximately 3.6 atomic % at a depth of approximately 6.8 nm and a nitrogen dose of approximately $5.3 \times 10^{14}$ atoms per cm$^2$. The oxynitride film-substrate interface is at approximately the same depth as the nitrogen peak concentration 34.

Yet another example of a silicon oxynitride film 50 grown according to one embodiment of the method has a nitrogen profile 32 as shown in FIG. 5C. In this example, the second wet process gas was flowed for 15 minutes (compared 5 and 10 minutes in FIGS. 5A and 5B, respectively) while keeping other processing conditions the same. FIG. 5C shows a nitrogen profile 32 having a nitrogen peak concentration 34 of approximately 4.1 atomic % at a depth of approximately 7.0 nm and a nitrogen dose of approximately $6 \times 10^{14}$ atoms per cm$^2$. The oxynitride film-substrate interface is at approximately the same depth as the nitrogen peak concentration 34.

Figure 5D:
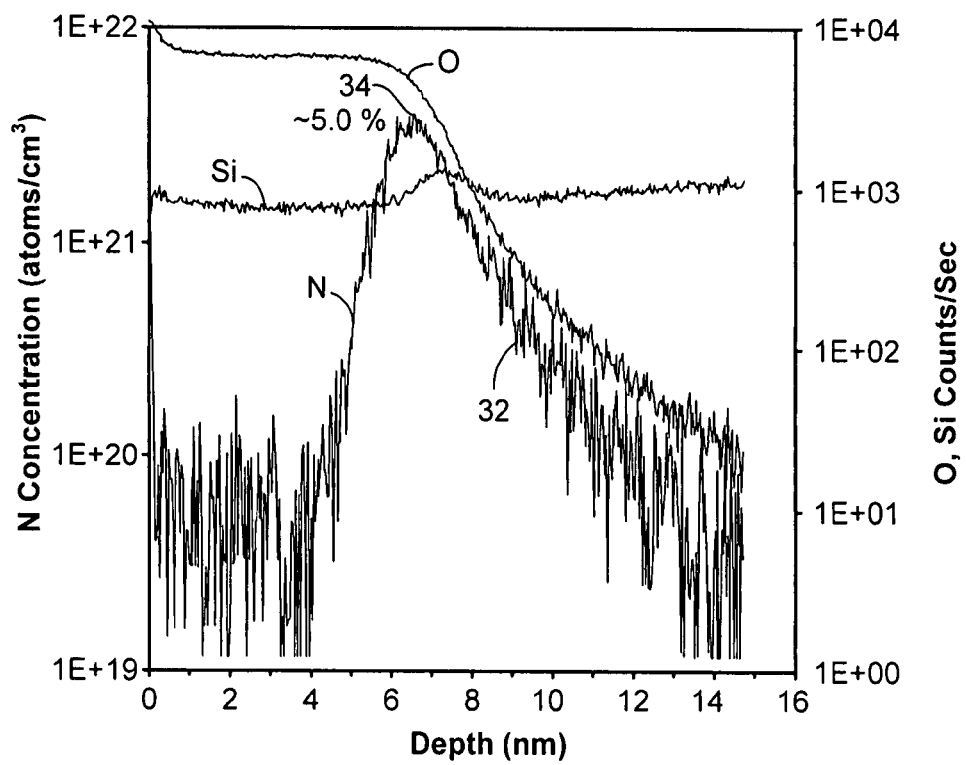

Still another example of a silicon oxynitride film 50 grown according to one embodiment of the method has a nitrogen profile 32 as shown in FIG. 5D. In this example, the second wet process gas was flowed for 20 minutes (compared 5, 10, and 15 minutes in FIGS. 5A, 5B, and 5C, respectively) while keeping other processing conditions the same. FIG. 5D shows a nitrogen profile 32 having a nitrogen peak concentration 34 of approximately 5 atomic % at a depth of approximately 7.1 nm and a nitrogen dose of approximately $8.1 \times 10^{14}$ atoms per cm$^2$. The oxynitride film-substrate interface is at approximately the same depth as the nitrogen peak concentration 34.

Figure 6:
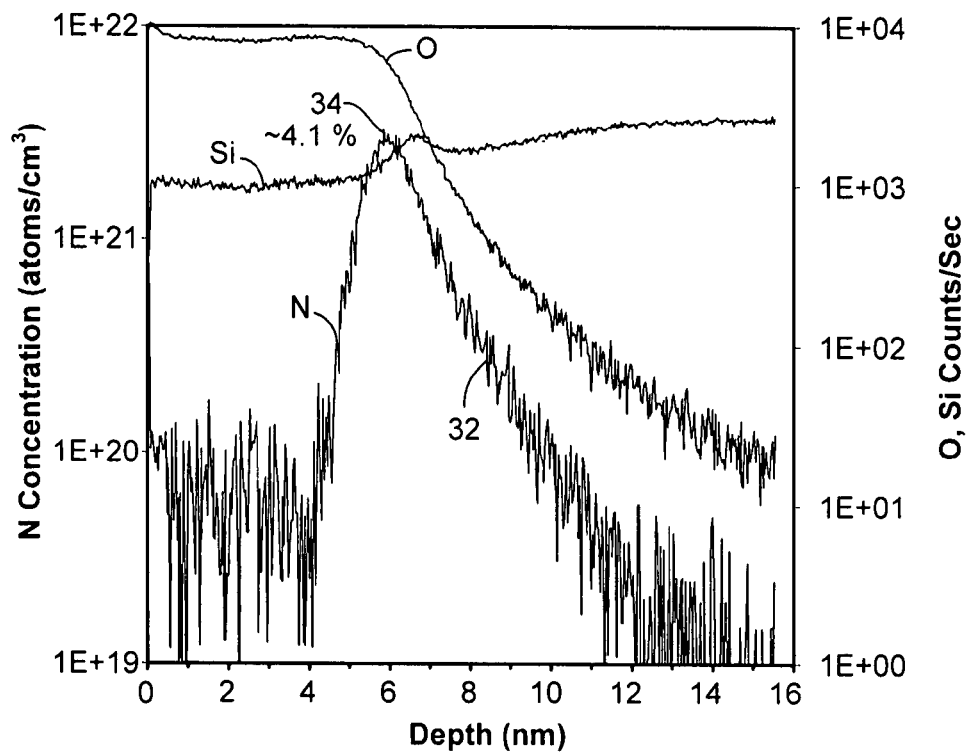
FIG. 6 shows a SIMS plot for a silicon oxynitride film grown according to an embodiment of the method.

FIG. 6 illustrates concentration profiles for another silicon oxynitride film 50 grown according to an embodiment of the present invention. In accordance with the method of the present invention, a silicon oxynitride film 50 with the nitrogen, oxygen, and silicon profiles shown in FIG. 6 was grown on a silicon substrate 40 using the following flow rates and temperatures. The processing temperature was approximately 900° C. and the processing pressure was approximately 615 Torr. The first wet process gas flowed for 16 minutes from the pyrogenic torch 18 to the process chamber 12 from an oxygen gas and hydrogen gas flow rate of approximately 0.2 slm each. The second wet process gas flowed for 15 minutes and further contained an nitric oxide gas flow rate of approximately 2 slm. The first and second wet process gases further contained a nitrogen diluting gas having a flow rate of approximately 1.8 slm. The silicon oxynitride film 50 with the SIMS plot shown in FIG. 6 had been further processed according to another embodiment of the method of the present invention by annealing the silicon oxynitride film 50 to reduce interface trap density (Dit) with silicon substrate 40. The annealing temperature was 900° C. The silicon oxynitride film 50 was held at that temperature for 60 minutes in an annealing gas consisting of nitrogen. The resulting silicon oxynitride film 50, having the SIMS plot, shown in FIG. 6 exhibited a nitrogen peak concentration 34 of approximately 4.1 atomic % nitrogen at a depth of approximately 7.5 nm and a nitrogen dose of approximately $5.4 \times 10^{14}$ atoms per $cm^2$, as shown. The oxynitride film-substrate interface is approximately at the same depth as the nitrogen peak concentration 34.

Figure 7A:
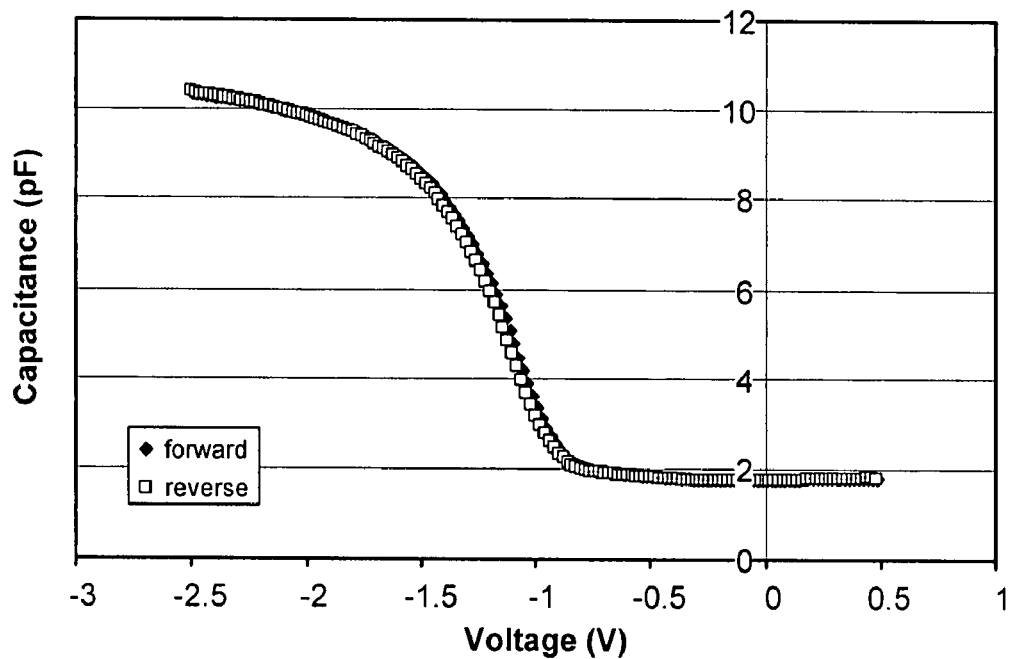
FIGS. 7A and 7B show capacitance-voltage curves for silicon oxynitride films having nitrogen peak concentrations of 3 atomic % and 5 atomic %, respectively.
Figure 7B:
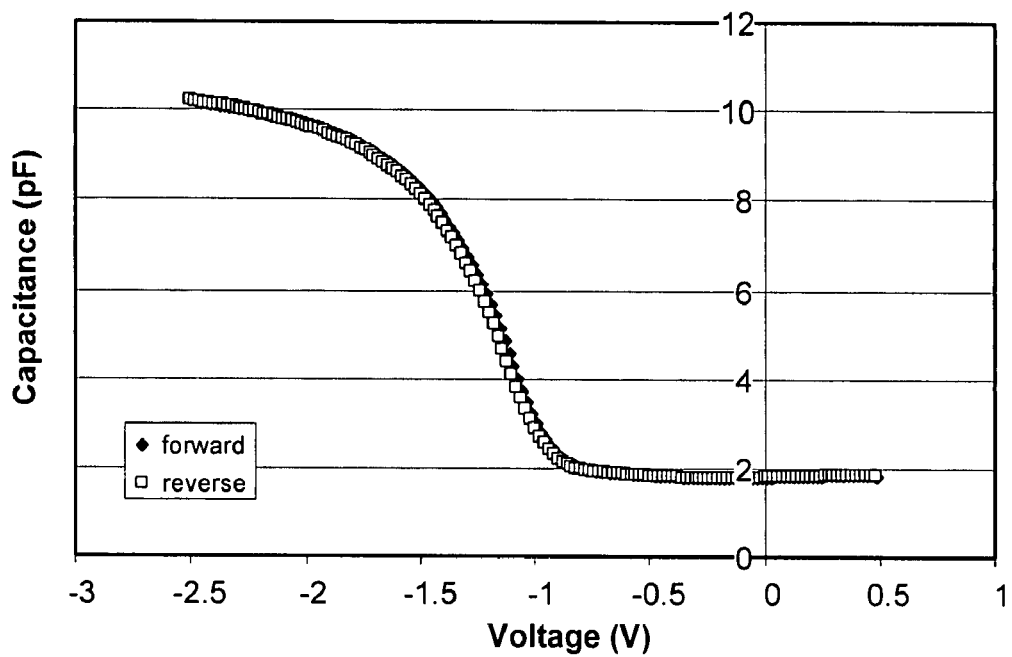

FIGS. 7A and 7B illustrate the electrical properties of silicon oxynitride films having nitrogen peak concentrations of 3 atomic % and 5 atomic %, respectively. The silicon oxynitride film of FIG. 7A was formed using the same processing conditions as the silicon oxynitride films of FIGS. 5A-5D, except that the first wet process gas was flowed for approximately 16.5 minutes from the pyrogenic torch 18 to the process chamber 12 and the second wet process gas was flowed for approximately 7 minutes. The capacitance-voltage (CV) curve for the silicon oxynitride films having nitrogen peak concentration of approximately 3 atomic % exhibited an interface density of $5.6 \times 10\ cm^{-2}eV^{-1}$. The silicon oxynitride film of FIG. 7B was formed using the same processing conditions as the silicon oxynitride films of FIG. 7A except that the first wet process gas was flowed for approximately 15.75 minutes from the pyrogenic torch 18 to the process chamber 12 and the second wet process gas was flowed for approximately 22 minutes. The capacitance-voltage (CV) curve for the silicon oxynitride films having nitrogen peak concentration of approximately 5 atomic % exhibited an interface density of $5.1 \times 10^{11}\ cm^{-2}eV^{-1}$. The silicon oxynitride films formed according to embodiments of the invention and having approximately 3 and 5 atomic % nitrogen peak concentration, exhibited lower Dit values than reported in the literature for advanced nitridation processes ($\sim 10^{12}\ cm^{-2}eV^{-1}$).

Figure 8:
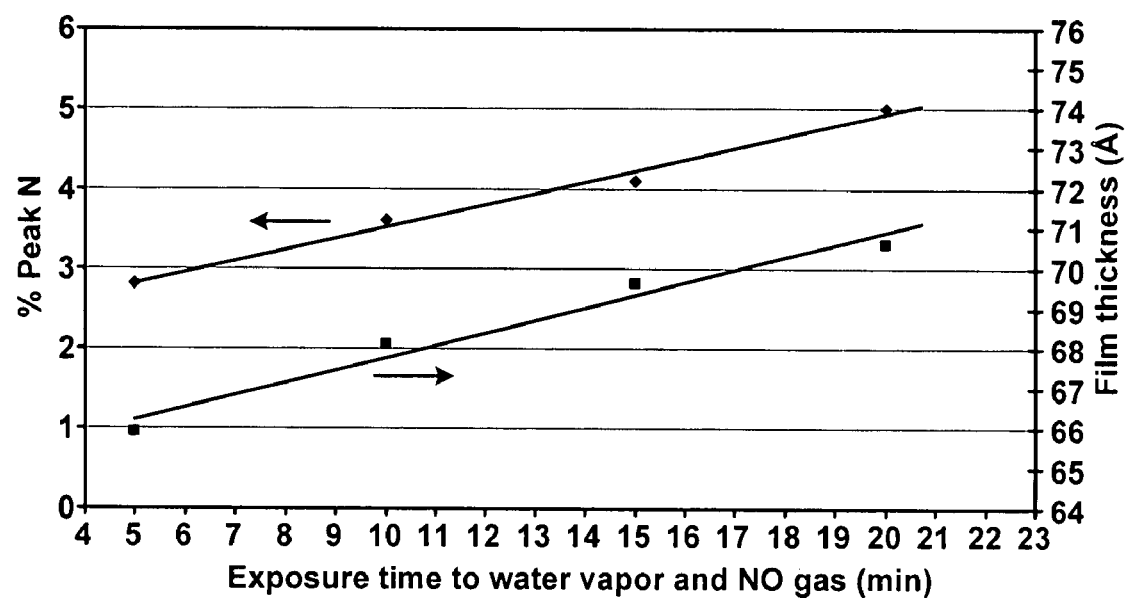
FIG. 8 shows a plot of flow times of a wet process gas containing water vapor and nitric oxide nitriding gas on the x-axis, with nitrogen peak concentration (% peak N) along the left y-axis and film thickness along the right y-axis for a number of silicon oxynitride films grown according to embodiments of the invention.

FIG. 8 show a plot of flow times of a wet process gas containing water vapor and nitric oxide nitriding gas on the x-axis, with nitrogen peak concentration (% peak N) along the left y-axis and film thickness along the right y-axis for a number of silicon oxynitride films grown according to embodiments of the invention. The plot in FIG. 8 summarizes the SIMS plots presented in FIGS. 5A-5D. In summary, the nitrogen peak concentration and the film thickness increase with increased flow times of the wet process gas containing water vapor and nitric oxide nitriding gas. Although the plot in FIG. 8 only shows nitrogen peak concentration up to approximately 5 atomic %, longer exposure times to water vapor and NO gas are expected provide nitrogen peak concentration greater than approximately 5 atomic %. For example, nitrogen peak concentration of approximately 6 atomic %, approximately 10 atomic %, or even approximately 15 atomic % are contemplated. FIG. 8 shows that a relatively thick silicon oxynitride films with similar nitrogen peak concentrations as the thin silicon oxynitride films described in the related invention in co-pending U.S. patent application Ser. No. 1/694,643.

While the present invention has been illustrated by the description of one or more embodiments thereof, and while the embodiments have been described in considerable detail, they are not intended to restrict or in any way limit the scope of the appended claims to such detail. Additional advantages and modifications will readily appear to those skilled in the art. The invention is therefore not limited to the specific details, representative apparatus and method and illustrative examples shown and described. In one example, a silicon oxynitride film can have a nitrogen peak concentration between approximately 3 atomic % and approximately 15 atomic %, between approximately 3 atomic % and approximately 6 atomic %, or between approximately 3 atomic % and approximately 5 atomic %. Accordingly, departures may be made from such details without departing from the scope of the general inventive concept.

What is claimed is:

1. A method for growing an oxynitride film on a substrate, the method comprising:
   positioning the substrate in a process chamber;
   heating the process chamber to a processing temperature;
   flowing a first wet process gas comprising water vapor into the process chamber;
   reacting the substrate with the first wet process gas to grow an oxide film on the substrate;
   flowing a second wet process gas comprising water vapor and a nitriding gas comprising nitric oxide into the process chamber; and
   reacting the oxide film and the substrate with the second wet process gas to grow an oxynitride film.

2. The method of claim 1, further comprising generating the water vapor external to the process chamber by combusting a hydrogen gas and an oxygen gas.

3. The method of claim 1, further comprising flowing a diluting gas into the process chamber while flowing the first wet process gas to control a growth rate of the oxide film, and flowing the diluting gas into the process chamber while flowing the second wet process gas to control a growth rate of the oxynitride film.

4. The method of claim 1, further comprising, after reacting with the second wet process gas, annealing the substrate having the oxynitride film thereon in an annealing gas comprising at least one of nitrogen, nitric oxide, nitrous oxide, oxygen, or water, or combinations thereof.

5. The method of claim 1, further comprising, after reacting with the second wet process gas, annealing the substrate having the oxynitride film thereon in an annealing gas consisting of nitrogen.

6. The method of claim 1, wherein the processing temperature is greater than approximately 600° C. and less than approximately 1100° C.

7. The method of claim 1, wherein the processing temperature is approximately 900° C.

8. The method of claim 1, wherein a processing pressure is maintained between approximately 500 Torr and approximately 760 Torr during the flowing of the first and second wet process gases.

9. The method of claim 1, wherein a thickness of the oxynitride film is greater than approximately 4 nm.

10. The method of claim 1, wherein a thickness of the oxynitride film is between approximately 5 nm and approximately 15 nm.

11. The method of claim 1, wherein a thickness of the oxynitride film is between approximately 6 nm and approximately 7 nm.

12. The method of claim 1, wherein the process chamber is in a batch processing system, and the positioning includes positioning a plurality of substrates in the process chamber whereby the oxynitride film is formed on each of the plurality of substrates.

13. The method of claim 1, wherein the substrate comprises silicon and whereby the reacting with the first and second wet process gases grows a silicon oxynitride film on the substrate.

14. The method of claim 13, wherein the substrate having the silicon oxynitride film thereon exhibits a nitrogen peak concentration between approximately 3 atomic % and approximately 15 atomic %.

15. The method of claim 13, wherein the substrate having the silicon oxynitride film thereon exhibits a nitrogen peak concentration in the silicon oxynitride film or at approximately the same depth as the silicon oxynitride film-silicon substrate interface.

16. The method of claim 13, further comprising controlling a ratio of the second wet process gas to the nitriding gas to control the nitrogen peak concentration in the silicon oxynitride film.

17. A method for growing a silicon oxynitride film on a plurality of substrates in a process chamber, the method comprising:

positioning the plurality of substrates in the process chamber of a batch processing system, the substrates comprising silicon;

heating the process chamber to a processing temperature of at least 850° C.;

generating water vapor external to the process chamber by combusting hydrogen gas and oxygen gas;

flowing a first wet process gas comprising the water vapor and a diluting gas comprising nitrogen into the process chamber;

reacting the substrate with the first wet process gas to grow a silicon oxide film on each of the plurality of substrates; and flowing a second wet process gas comprising the water vapor, a diluting gas comprising nitrogen, and a nitriding gas comprising nitric oxide into the process chamber; and reacting the silicon oxide film and the substrate with the second wet process gas to grow a silicon oxynitride film having a thickness greater than approximately 4 nm on the substrate, wherein a processing pressure between approximately 500 Torr and approximately 760 Torr is maintained during the flowing of the first and second wet process gases.

18. The method of claim 17, further comprising:

annealing the substrate having the silicon oxynitride film thereon in an annealing gas comprising nitrogen, wherein the annealed silicon oxynitride film has a nitrogen peak concentration between approximately 3 atomic % and approximately 15 atomic %.

19. A method for growing a silicon oxynitride film on a substrate, the method comprising:

positioning the substrate in a process chamber, the substrate comprising silicon;

heating the process chamber to a processing temperature of at least 850° C.;

generating water vapor external to the process chamber by combusting hydrogen gas and oxygen gas;

continuously flowing a first wet process gas comprising the water vapor and a diluting gas comprising nitrogen gas into the process chamber;

reacting the substrate with the first wet process gas to grow a silicon oxide film on the substrate;

generating a second wet process gas by adding a nitriding gas comprising nitric oxide to the continuous flow of the first wet process gas; and reacting the silicon oxide film and the substrate with the second wet process gas to grow a silicon oxynitride film having a thickness greater than approximately 4 nm, wherein a processing pressure between approximately 500 Torr and approximately 760 Torr is maintained in the process chamber during the flowing of the first and second wet process gases.

20. The method of claim 19, further comprising:

annealing the substrate having the silicon oxynitride film thereon in an annealing gas comprising nitrogen, wherein the annealed silicon oxynitride film has a nitrogen peak concentration between approximately 3 atomic % and approximately 15 atomic %.

* * * * *